United States Patent
Chun et al.

(10) Patent No.: US 7,800,944 B2
(45) Date of Patent: Sep. 21, 2010

(54) NONVOLATILE SEMICONDUCTOR MEMORY DEVICE AND PROGRAMMING METHOD THEREOF

(75) Inventors: Jin-Young Chun, Seoul (KR); Jae-Yong Jeong, Yongin-si (KR); Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 161 days.

(21) Appl. No.: 12/129,820

(22) Filed: May 30, 2008

(65) Prior Publication Data

US 2009/0003056 A1 Jan. 1, 2009

(30) Foreign Application Priority Data

Jun. 28, 2007 (KR) .................. 10-2007-0064556

(51) Int. Cl.
*G11C 11/34* (2006.01)
(52) U.S. Cl. ............................ 365/185.03; 365/185.24
(58) Field of Classification Search ............ 365/185.03, 365/185.24
See application file for complete search history.

(56) References Cited

U.S. PATENT DOCUMENTS

| 6,522,580 B2 * | 2/2003 | Chen et al. ............. 365/185.02 |
| 7,379,342 B2 | 5/2008 | Park et al. |
| 7,489,558 B2 | 2/2009 | Choi et al. |

FOREIGN PATENT DOCUMENTS

| JP | 09-320285 | 12/1997 |
| JP | 2006-190488 | 7/2006 |
| KR | 10-1999-0083409 | 11/1999 |
| KR | 1020060122590 A | 11/2006 |
| KR | 100732631 B1 | 6/2007 |

* cited by examiner

*Primary Examiner*—Michael T Tran
(74) *Attorney, Agent, or Firm*—Volentine & Whitt, P.L.L.C.

(57) ABSTRACT

Disclosed is a nonvolatile memory device and programming method of a nonvolatile memory device. The programming method of the nonvolatile memory device includes conducting a first programming operation for a memory cell, retrieving original data from the memory cell after the first programming operation, and conducting a second programming operation with reference to the original data and a second verifying voltage higher than a first verifying voltage of the first programming operation.

11 Claims, 9 Drawing Sheets

NONVOLATILE SEMICONDUCTOR MEMORY DEVICE AND PROGRAMMING METHOD THEREOF

CROSS-REFERENCE TO RELATED APPLICATION

A claim of priority is made to Korean Patent Application No. 10-2007-0064556, filed on Jun. 28, 2007, the subject matter of which is hereby incorporated by reference.

BACKGROUND

The present invention relates to semiconductor memory devices, and more particularly, to a nonvolatile memory device and a programming method of the same.

Semiconductor memory devices are storage units for storing and retrieving data in accordance with system and/or user requirements. Semiconductor memory devices generally may be classified as random access memories (RAMs) and read-only memories (ROMs). ROMs are able to retain stored data even when there is no power supply. Types of ROMs include, for example, programmable ROMs (PROMs), erasable programmable ROMs (EPROMs), electrically erasable and programmable ROMs (EEPROMs) and flash memories. Flash memories are classified as NAND-type or NOR type flash memory devices. NOR-type flash memory devices operate at higher speeds than NAND-type flash memory devices, which are mostly employed in mobile telephone terminals requiring high frequency data processing.

In order to increase information storage capacity, many studies are underway to address multi-bit cell technology, which enables a single memory cell to store multiple bits. A memory cell capable of storing multiple bits is called a multi-level cell (MLC), as compared to a memory cell capable of storing a single bit, which is called a single level cell (SLC).

An MLC is selectively conditioned in one of multiple possible threshold-voltage distributions. For example, an MLC capable of storing two bits may belong to one of four threshold-voltage distributions ("11", "10", "01" and "00"). To read data from such an MLC, the corresponding threshold voltage must be more precisely controlled than the threshold voltage of an SLC.

SUMMARY OF THE INVENTION

An aspect of the present invention provides a programming method for a flash memory device. The method includes conducting a first programming operation for a memory cell, retrieving original data from the memory cell after the first programming operation, and conducting a second programming operation with reference to the original data and a second verifying voltage higher than a first verifying voltage of the first programming operation.

The second programming operation may be performed without verifying data corresponding to a highest threshold-voltage distribution.

The flash memory device may be a NOR type flash memory device. Also, the memory cell may be a multi-level cell, such as a memory cell configured to store two-bit data.

The second verifying voltage used in the second programming operation may gradually increase to a predetermined level higher than the first verifying voltage of the first programming voltage. The second programming operation may be performed without verifying data corresponding to a highest threshold-voltage distribution.

Another aspect of the present invention provides a nonvolatile memory device including a memory cell array, a reading/programming circuit, a data buffer and a controller. The memory cell array includes memory cells arranged in rows and columns. The reading/programming circuit is configured to conduct a reading operation and a programming operation for the memory cell array. The data buffer is configured to store data retrieved from the reading operation and data to be programmed by the programming operation. The controller is configured to enable the reading/programming circuit and the data buffer to conduct a first programming operation of the memory cells, a retrieve-reading operation to read original data from the memory cells, and a second programming operation of the memory cells based on the original data.

The second programming operation may be performed with a second verifying voltage higher than a first verifying voltage used in the first programming voltage. Also, the second programming operation may be performed without verifying data corresponding to a highest threshold-voltage distribution. The memory cell may be a multi-level cell, such as a memory cell configured to store two-bit data. A second verifying voltage used in the second programming operation may gradually increase to a predetermined level higher than a first verifying voltage of the first programming voltage.

Another aspect of the present invention provides a memory card including a flash memory device and a memory controller configured to control the flash memory device. The flash memory device is programmed to conduct a first programming operation for a memory cell, retrieve original data from the memory cell after the first programming operation, and conduct a second programming operation with reference to the original data and a second verifying voltage higher than a first verifying voltage of the first programming operation.

Another aspect of the present invention provides a memory card including a flash memory device and a memory controller configured to control the flash memory device. The flash memory device is programmed to conduct a first programming operation for a memory cell, retrieve original data from the memory cell after the first programming operation, and conduct a second programming operation with reference to the original data and a second verifying voltage higher than a first verifying voltage of the first programming operation. The second verifying voltage used in the second programming operation gradually increases to a predetermined level higher than the first verifying voltage of the first programming voltage.

Another aspect of the present invention provides a memory card including a flash memory device and a memory controller configured to control the flash memory device. The flash memory device includes a memory cell array having memory cells arranged in rows and columns; a reading/programming circuit configured to conduct a reading operation and a programming operation for the memory cell array; a data buffer configured to store data retrieved from the reading operation and data to be programmed by the programming operation; and a controller configured to enable the reading/programming circuit and the data buffer to conduct a first programming operation of the memory cells, a retrieve-reading operation to read original data from the memory cells, and a second programming operation of the memory cells based on the original data.

Further, another aspect of the present invention provides a memory card including a flash memory device and a memory controller configured to control the flash memory device. The flash memory device includes a memory cell array having memory cells arranged in rows and columns; a reading/programming circuit configured to conduct a reading operation and a programming operation for the memory cell array; a data buffer configured to store data retrieved from the reading operation and data to be programmed by the programming operation; and a controller configured to enable the reading/programming circuit and the data buffer to conduct a first programming operation of the memory cells, a retrieve-reading operation to read original data from the memory cells, and a second programming operation of the memory cells based on the original data. A second verifying voltage used in the second programming operation gradually increases to a predetermined level higher than a first verifying voltage of the first programming voltage.

Further description of the nature and advantages of embodiments of the present invention are provided with reference to the specification and attached figures.

BRIEF DESCRIPTION OF THE FIGURES

Non-limiting and non-exhaustive embodiments of the present invention will be described with reference to the attached drawings, in which like reference numerals refer to like parts throughout the figures, unless otherwise specified. In the figures.

DETAILED DESCRIPTION OF THE EMBODIMENTS

Figure 1:
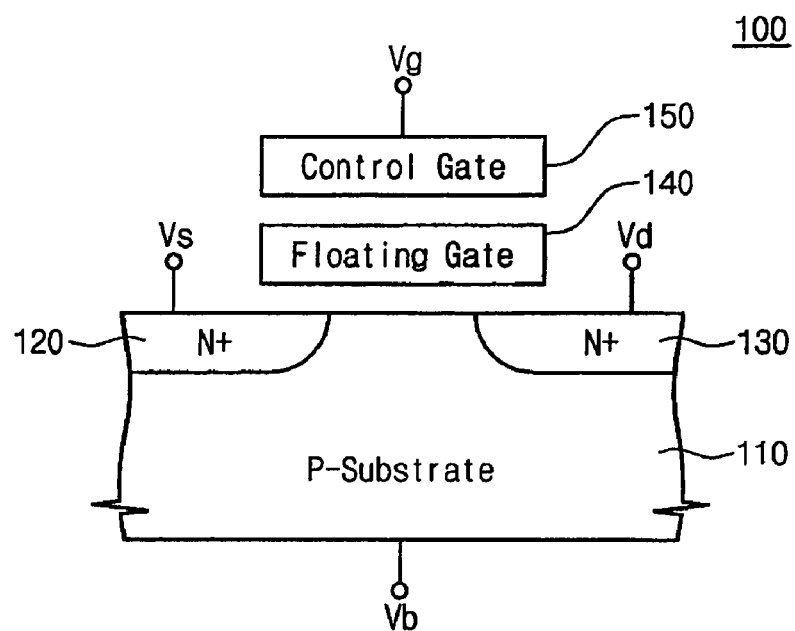
FIG. 1 is a sectional diagram of a memory cell in a general flash memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements and techniques are not described with respect to some of the embodiments of the present invention. Throughout the drawings and written description, like reference numerals will be used to refer to like or similar elements.

Embodiments of the present invention generally include a nonvolatile memory device capable of repeating programming operations without an additional data buffer. The nonvolatile memory device provides higher integration density and lower product cost, for example.

FIG. 1 is a sectional diagram of a memory cell in a general flash memory device.

Referring to FIG. 1, a flash memory cell 100 is formed by including N+ source and drain regions 120 and 130 in a P-type semiconductor substrate 110. The flash memory cell 100 also includes a floating gate 140, interposing an insulation film with a channel region, and a control gate 150, interposing an intergate insulation film with the floating gate 140. Voltage terminals for Vs, Vd, Vg and Vb are respectively connected to the source region 120, the drain region 130, the control gate 150 and the semiconductor substrate 110 to apply appropriate voltages for programming, erasing and reading operations.

Figure 2:
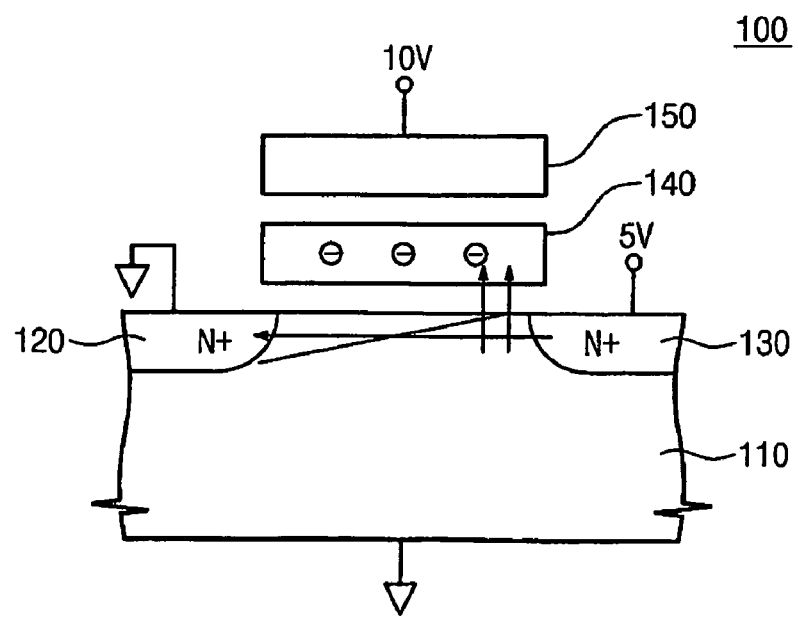
FIG. 2 is a sectional diagram showing a bias condition in a programming mode of a general NOR type flash memory device.

FIG. 2 is a sectional diagram of a memory cell in a general flash memory device, showing an exemplary bias condition in a programming mode of a NOR type flash memory device.

Referring to FIG. 2, in the programming mode, the source region 120 and the substrate 110 are supplied with ground potential (0V). The control gate 150 is supplied with a high voltage of about 10V and the drain region 130 is supplied with a voltage of 5V. Under this bias condition, an electric field is induced from the drain region 130 toward the source region 120. As shown in FIG. 2, electrons are injected into the floating gate 140 from the channel region adjacent to the drain region 130. This mechanism is called "channel hot electron injection." which is differentiated from the mechanism of Fowler-Nordheim (F-N) tunneling used in a NAND flash memory device.

The programming operation charges the floating gate 140 with a negative potential. The negative potential of the floating gate 140 raises a threshold voltage of the memory cell 100 during the reading operation. The memory cell 100 in this condition is called "off-cell" because there is no conduction between the source region 120 and the drain region 130, even though a read voltage is applied to the control gate 150.

Figure 3:
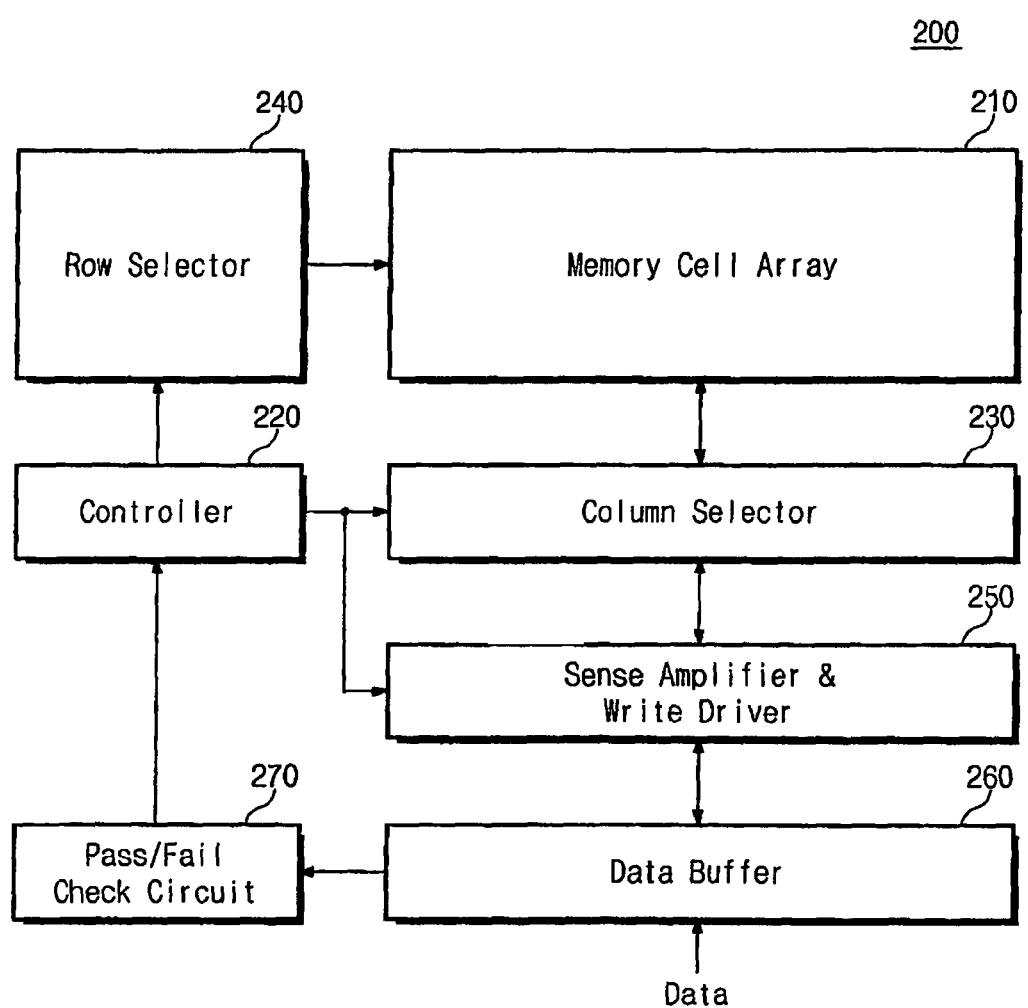
FIG. 3 is a block diagram of a nonvolatile memory device, according to exemplary embodiments of the present invention.

FIG. 3 is a block diagram of a nonvolatile memory device, according to exemplary embodiments of the present invention.

Referring to FIG. 3, the nonvolatile memory device 200 includes a memory cell array 210, a control circuit or controller 220, a column selector 230, a row selector 240, a sense amplifier and write driver (SA/WD) 250, a data buffer 260 and a pass/fail check circuit 270.

Although not shown in the figures, the memory cell array 210 is formed of memory cells arranged in a matrix of rows (or word lines) and columns (or bit lines). The memory cells may be arranged to organize a NAND or NOR logical circuit structure. The NAND structure is configured such that multiple memory cells are connected to a unit bit line in series. The NOR structure is configured such that multiple memory cells are connected to a unit bit line in parallel. In FIG. 3, it is assumed that the memory cells are arranged in the NOR structure.

The controller 220 is configured to control overall operation of the nonvolatile memory device 200. For example, the controller 220 enables the row selector 240 to supply voltages each to selected and deselected word lines. Further, the controller 220 enables the column selector 230 to select a specific bit line. However, the controller 220 is not limited to these functions. The controller 220 is generally configured to perform various functions to control reading, erasing and testing operations of the nonvolatile semiconductor memory device 200.

The row selector 240 operates under control of the controller 220, driving selected and deselected word lines to their corresponding word line voltages in response to row addresses (not shown). For instance, in the programming operation, the row selector 240 drives a selected row (selected word line) to a high voltage and drives deselected rows (deselected word lines) to a low or ground voltage. In the reading operation, the row selector 240 drives a selected row to a reading voltage and drives deselected rows to the low or ground voltage.

The column selector 230 operates under control of the controller 220, designating a specific one of the multiple bit lines in response to column addresses (not shown).

The SA/WD 250 stores data in the memory cell array 210 and reads out data from the memory cell array 210. In the reading operation, the SA/WD 250 operates as a sense amplifier and reads data from the memory cell array 210. The read data is stored in the data buffer 260. In a writing operation, the SA/WD 250 operates as a write driver and stores data in the memory cell array 210 from the data buffer 260. Operations of the SA/WD 250 for reading data from the memory cell array 210 or storing data in the memory cell array 210 are generally known by one skilled in the art.

The data buffer 260 transfers externally provided data to the SA/WD 250. The data buffer 260 also externally outputs data from the SA/WD 250.

The pass/fail check circuit 270 determines whether data held in the data buffer 260 are conditioned in a program pass or fail state. When data of the data buffer 260 are all conditioned in the program pass state, the pass/fail check circuit 270 provides the controller 220 with a signal indicating the program pass state. Otherwise, when data of the data buffer 260 are partly conditioned in the program fail state, the pass/fail check circuit 270 provides the controller 220 with a signal indicating the program fail state.

A programming operation of the nonvolatile memory device 200, having the structure discussed above, may be performed as indicated in FIG. 4, which is a flow chart showing a programming method for the nonvolatile memory device, according to exemplary embodiments of the present invention.

Figure 4:
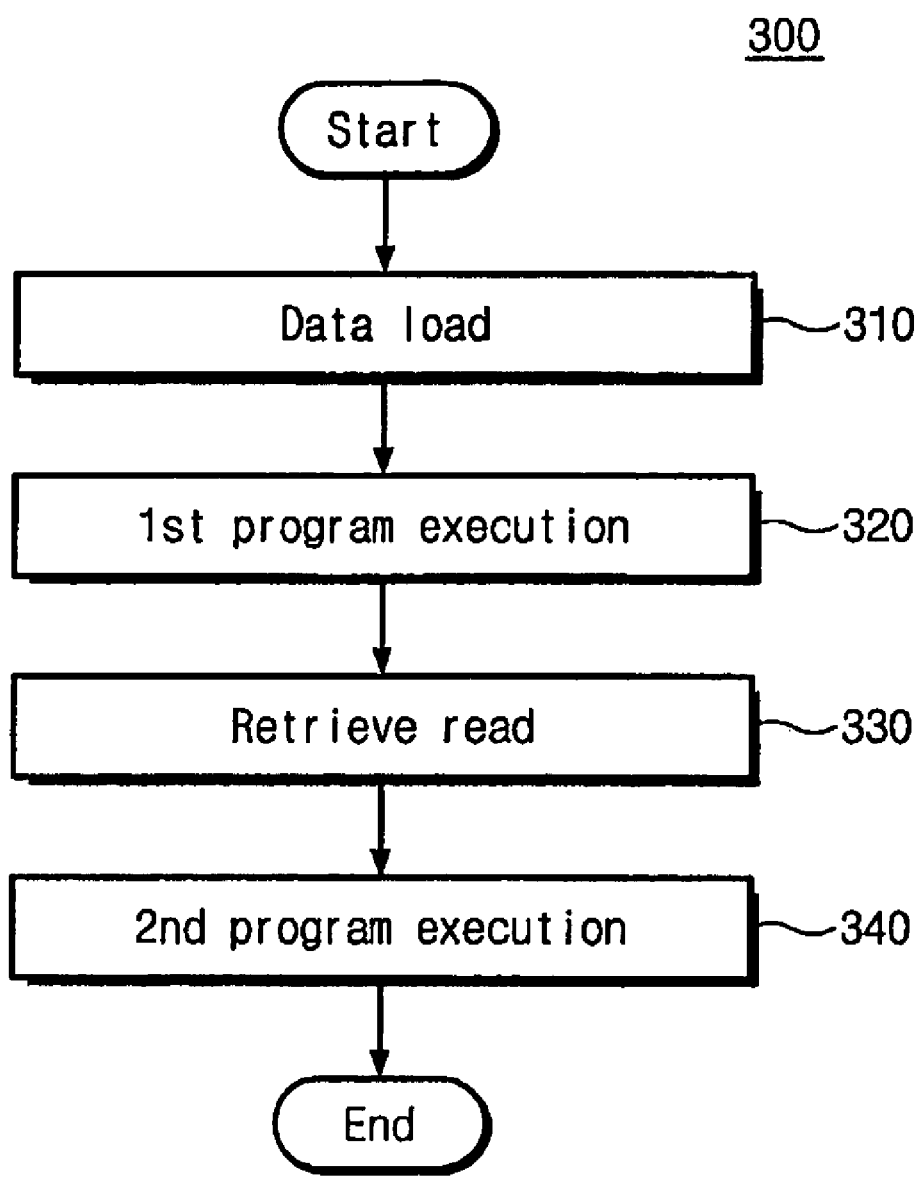
FIG. 4 is a flow chart showing a programming method for the nonvolatile memory device, according to exemplary embodiments of the present invention.

Referring to FIG. 4, data to be programmed (hereinafter, referred to as "program data") are loaded into the data buffer 260 (e.g., data load operation 310). According to various embodiments of the present invention, the programming operation is conducted at least twice. The first programming operation 320 is executed using a verifying voltage Vvfy and the second programming operation 340 is executed using a target voltage Vtgt, which is set as a higher verifying voltage for at least memory cells storing data "10" and "01". For multi-level cells (MLCs), successfully detecting a cell state requires relatively wide intervals between consecutive threshold-voltage distributions. Consistent with this requirement, the second programming operation 340 helps to extend the intervals between the threshold-voltage distributions. The second programming operation 340 may be executed only for memory cells storing data "10" and "01", which shortens programming time by skipping the second programming operation for the memory cells storing data "00". However, it is permissible to execute the additional programming operation (e.g., operation 320) even for the memory cells storing data "00". The first and second programming operations 320 and 340 will be further detailed below.

After completing the first programming operation 320, the data buffer 260 stores pass data indicating that the first programming operation 320 has been passed. A pattern of the pass data is variable. In an embodiment, it is assumed that the pass data (bit) is "1". Further to completion of the first programming operation 320, the original data stored in the data buffer 260 is replaced by the pass data. However, since the second programming operation 340 must be executed using the original data, a retrieve-reading operation 330 is required. The retrieve-reading operation 330 is an operation for reading the original data from a memory cell and saving the original data in the data buffer 260.

The retrieve-reading operation 330 is executed in the same manner as a general reading operation. For example, in the retrieve-reading operation 330, a reading voltage leveled between neighboring threshold-voltage distributions is applied to a control gate of the selected memory cell, and the ground voltage is applied to control gates of the deselected memory cells.

The second programming operation 340 is performed using a verifying voltage higher than that of the first programming operation 320. Accordingly, the nonvolatile memory device is programmed by repeating the previously discussed steps without an additional data buffer for storing the original data. Thus, chip integration density may be increased since there is no need for an additional data buffer for storing the original data. Although two programming operations (first and second programming operations 320 and 340) are shown, it is understood that additional programming operations may be included, e.g., by repeating the aforementioned procedure.

Figure 5:
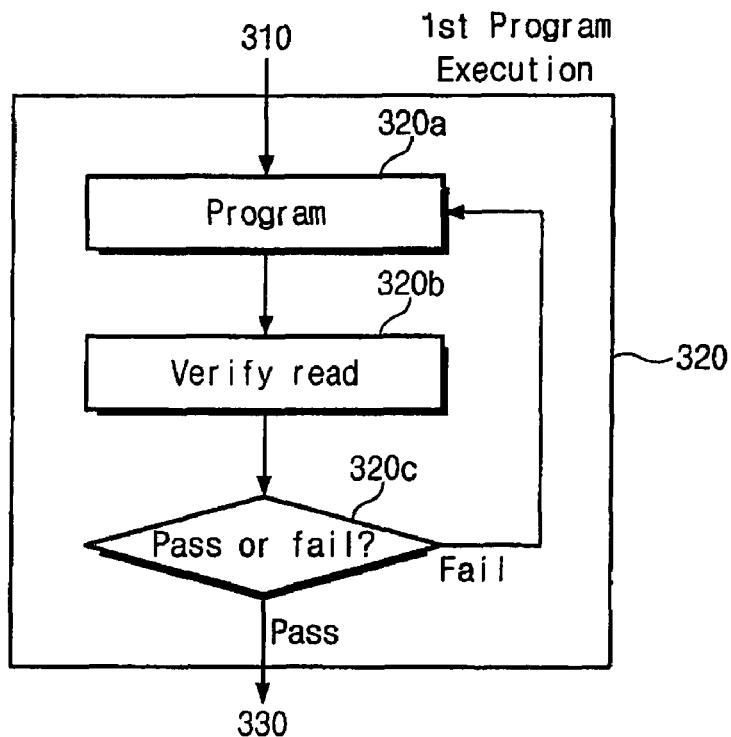
FIG. 5 is a flow chart showing the first programming operation of FIG. 4, in detail, according to exemplary embodiments of the present invention.

FIG. 5 is a flow chart showing the first programming operation 320 of FIG. 4, in detail, according to exemplary embodiments of the present invention.

Referring to FIG. 5, voltages for programming are applied to the memory cells (programming step 320a). Accordingly, the memory cells are set as data "11", "10", "01/" and "00", respectively. The data sequence according to threshold voltages may vary based in different configurations or circumstances. It will be assumed for purposes of explanation that the first programming operation for the memory cells stores data "11", "10", "01" and "00" in order from the lowest to the highest threshold voltage. Notably, a memory cell having data "11" is conditioned in an erased state, so there is no need to execute the additional programming operation.

The programming operation is divisionally performed for the most significant bit (MSB) and the least significant bit (LSB), respectively, along increments of the programming voltage. For instance, storing data "00" in the memory cell may be performed in the sequence of "11"→"10"→"00". The change from "11" to "10" corresponds to a change of the LSB, and the change from "10" to "00" corresponds to a change of the MSB. After applying the programming voltage to the memory cells, a verifying read step 320b begins to check whether the memory cells have been normally programmed.

The verifying read step 320b verifies that the memory cell has a threshold voltage corresponding to the original data. Three verifying voltages VFY_H, VFY_M, and VFY_L are used to perform the verifying read step 320b, resulting in a pass or fail determination at pass/fail checking step 320c. The following description is one example of multiple ways to perform the verifying read step 320b and the pass/fail checking step 320c, which may be altered in accordance with characteristics of the memory cells.

The verifying voltage VFY_H is used for determining that a selected memory cell is storing data "00". If the selected memory cell (or cell transistor) is turned off when the verifying voltage VFY_H is applied to its control gate, it means that the selected memory cell is storing data "00". However, if the selected memory cell is turned on when the verifying voltage VFY_H is applied to the control gate, it means that the selected memory cell has failed in programming. Thus, an additional programming operation is required for the program-failed memory cell.

The verifying voltage VFY_M is used for determining that a selected memory cell is storing data "01". If the selected memory cell (or cell transistor) is turned off when the verifying voltage VFY_M is applied to its control gate, it means that the selected memory cell is storing data "01". However, when the selected memory cell is turned on when the verifying voltage VFY_M is applied to the control gate, it means that the selected memory cell has failed in programming. Thus, an additional programming operation is required for the program-failed memory cell.

The verifying voltage VFY_L is used for determining that a selected memory cell is storing data "10". If the selected memory cell (or cell transistor) is turned off when the verifying voltage VFY_L is applied to its control gate, it means that the selected memory cell is storing data "10". However, if the selected memory cell is turned on when the verifying voltage VFY_L is applied to the control gate, it means that the selected memory cell has failed in programming. Thus, an additional programming operation is required for the program-failed memory cell. These steps of the first programming operation, 320a, 320b and 320c, will be repeated in a predetermined number of cycles.

Figure 6:
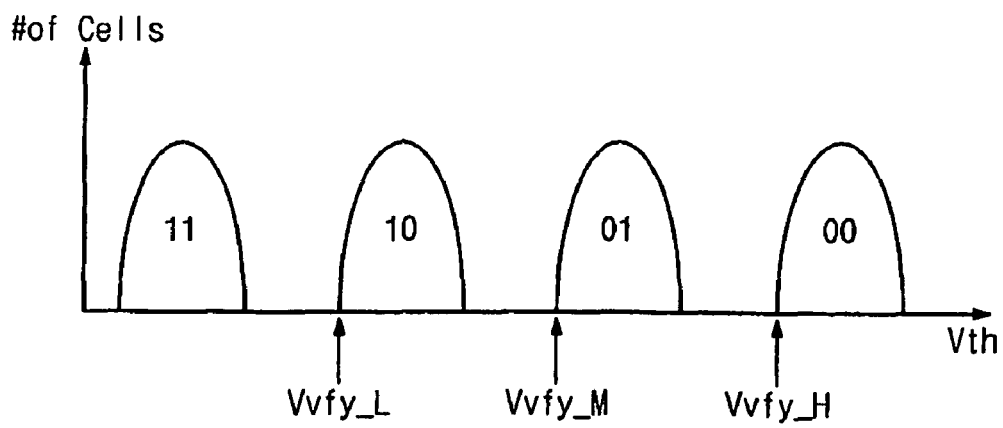
FIG. 6 is a graphic diagram showing threshold-voltage distribution profiles of memory cells after the first programming operation, according to exemplary embodiments of the present invention.

FIG. 6 is a graphic diagram showing threshold-voltage distribution profiles of memory cells after the first programming operation 320. For convenience of illustration, FIG. 6 shows the threshold-voltage distributions of multiple memory cells on a single graphic plane. As shown in FIG. 6, a group of memory cells may store data "10" while another group of memory cells may store data "00", for example.

Referring to FIG. 6, since the first programming operation has been completed, the programmed memory cells have threshold voltages corresponding to their stored data. As shown in FIG. 6, the memory cells storing data "10" are conditioned in a threshold-voltage distribution level higher than the verifying voltage Vvfy_L. The memory cells storing data "01" are conditioned in a threshold-voltage distribution level higher than the verifying voltage Vvfy_M. The memory cells storing data "00" are conditioned in a threshold-voltage distribution level higher than the verifying voltage Vvfy_H. In this manner, two-bit data can be stored in a single memory cell (or a unit memory cell).

After the first programming operation 320, the retrieve-reading operation 330 begins. In the retrieve-reading operation 330, as previously discussed, the original data to be programmed in the subsequent second programming operation 340 is read out from the memory cell and saved in the data buffer 260.

Figure 7:
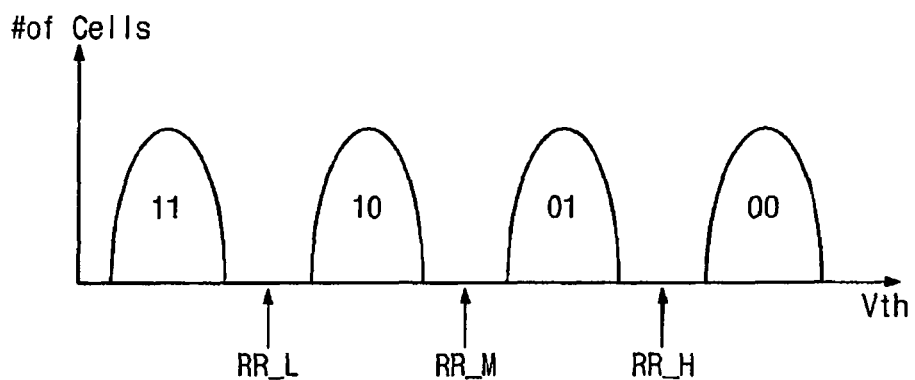
FIG. 7 is a graphic diagram showing a scheme of applying voltages in a retrieve-reading operation, according to exemplary embodiments of the present invention.

FIG. 7 is a graphic diagram showing a scheme of applying voltages in the retrieve-reading operation, according to exemplary embodiments of the present invention.

Referring to FIG. 7, the retrieve-reading operation 330 is executed in the same manner as a general reading operation. In other words, the general reading operation may be employed without adapting a peculiar way of reading. One of several possible methods of performing the reading operation is discussed below, as an example.

If the cell transistor of the memory cell is turned off when the retrieve-reading voltage RR_H is applied to a control gate of the memory cell, it indicates that the memory cell is storing data "00". The retrieve-reading voltage RR_H may be established between the threshold-voltage distributions of data "01" and "00". However, if the cell transistor of the memory cell is turned on when the retrieve-reading voltage RR_H is applied to the control gate of the memory cell, it denotes the memory cell is storing data other than data "00", i.e., data "11", "10" or "01". Thus, an additional retrieve-reading operation must be performed.

If the cell transistor of the memory cell is turned off when the retrieve-reading voltage RR_M is applied to the control gate of the memory cell, it indicates that the memory cell is storing data "01". The retrieve-reading voltage RR_M may be established between the threshold-voltage distributions of data "10" and "01". If the cell transistor of the memory cell is turned on when the retrieve-reading voltage RR_M is applied to the control gate of the memory cell, it indicates that the memory cell is storing data "11" or "10". Thus, an additional retrieve-reading operation must be performed.

If the cell transistor of the memory cell is turned off when the retrieve-reading voltage RR_L is applied to the control gate of the memory cell, it indicates that the memory cell is storing data "10". The retrieve-reading voltage RR_L may be established between the threshold-voltage distributions of data "11" and "10". If the cell transistor of the memory cell is turned on when the retrieve-reading voltage RR_L is applied to the control gate of the memory cell, it denotes that the memory cell is storing data "11". In this manner, it is possible to read data from the memory cell. It is understood that this is just one of many ways for to read data from the memory cell, although it is possible to adopt various other reading methods for verification.

Data read by the retrieve-reading operation 330 is stored in the data buffer 260 and used in the second programming operation 340, which begins after the retrieve-reading operation 330.

Figure 8:
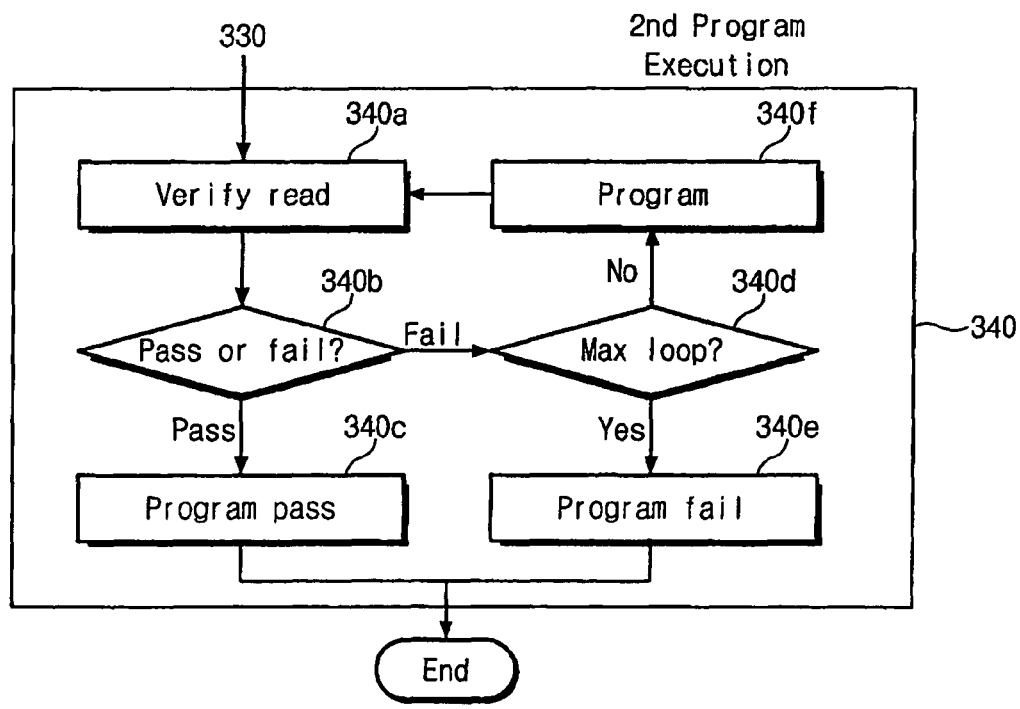
FIG. 8 is a flow chart showing a second programming operation, according to a first exemplary embodiment of the present invention.

FIG. 8 is a detailed flow chart showing the second programming operation 340, in accordance with a first exemplary embodiment of the present invention.

Referring to FIG. 8, the second programming operation 340 may be performed only for memory cells storing data "10" and "01". This accelerates the programming rate by skipping programming operations for memory cells storing data "00", as mentioned above. However, it is also possible to perform the programming operation for memory cells storing data "00" in order to precisely control the threshold-voltage distributions.

Figure 9A:
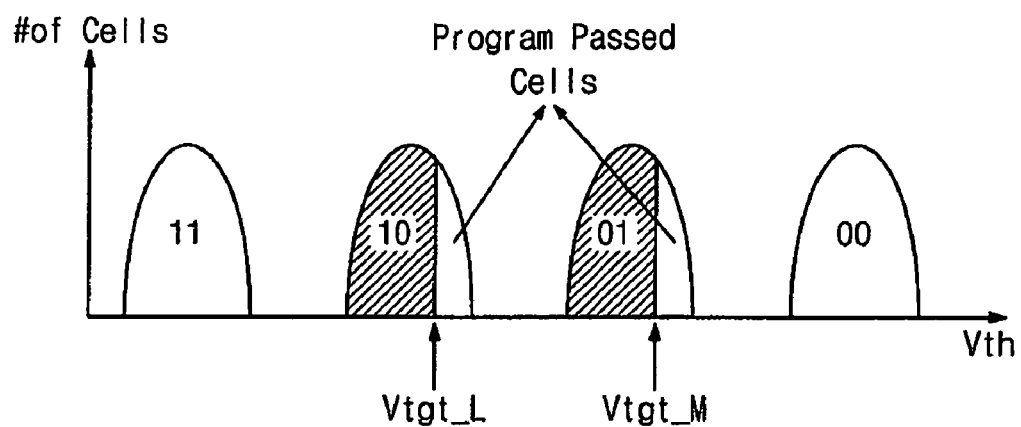
FIG. 9A is a graphic diagram of threshold-voltage distribution profiles of memory cells during the second programming operation, according to a first exemplary embodiment of the present invention.

FIG. 9A is a graphic diagram of threshold-voltage distribution profiles of memory cells during the second programming operation 340.

Referring to FIG. 9A, the target voltages Vtgt of the second programming operation 340 is higher than the corresponding verifying voltages Vvfy of the first programming operation 320. By executing the second programming operation 340 with reference to the higher target voltage Vtgt, the intervals of the threshold-voltage distributions become narrower.

Returning to FIG. 8, in the second programming operation 340, verifying read step 340a is executed before programming step 340f, which is different from the first programming operation, discussed above. This is for the purpose of accelerating the programming rate by skipping the programming step 340f for the memory cells that satisfy a program-pass condition Vth>Vtgt. Also, it is possible for the verifying read step 340a to be executed after the programming step 340f.

When a programmed result is detected as passed by a pass/fail checking step 340b, the programming operation passes and is completed (step 340c), and further programming operations are not conducted. If the programmed result is detected as failed by the pass/fail checking step 340b, it is determined whether a current loop has reached a maximum loop at loop checking step 340d. The determination of whether the current loop has reached the maximum loop is conducted by the control circuit 220. If the current loop has reached the maximum loop, a determination is made that the programmed result has failed at programming fail step 340e, and the programming operation is stopped. If the current loop has not yet reached the maximum loop, the programming operation resumes at step 340f, and the verifying read step 340a is again executed.

Figure 9B:
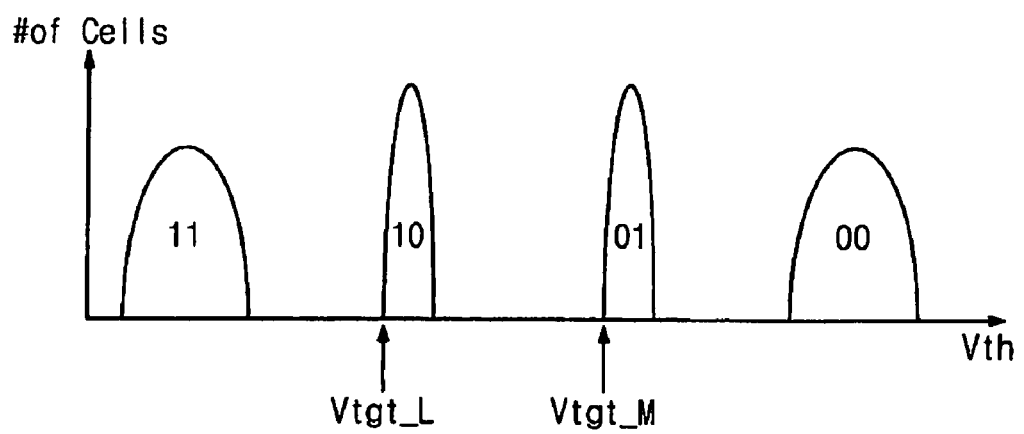
FIG. 9B is a graphic diagram of threshold-voltage distribution profiles of memory cells after the second programming operation, according to a first exemplary embodiment of the present invention.

FIG. 9B is a graphic diagram of threshold-voltage distribution profiles of memory cells after the second programming operation, according to a first exemplary embodiment of the present invention.

FIG. 9B shows that widths of the threshold-voltage distributions for the memory cells storing data "10" and "01" tend to be narrower after the second programming operation 340 than after the first programming operation 320. Since the memory cells storing data "11" and "00" are not subject to the second programming operation 340, their threshold-voltage distribution widths remain the same as after the first programming operation 320. In the same manner, the retrieve reading operation 330 and the second programming operation 340 may be repeated, for example, to further narrow the threshold-voltage distribution widths of the memory cells.

Figure 10:
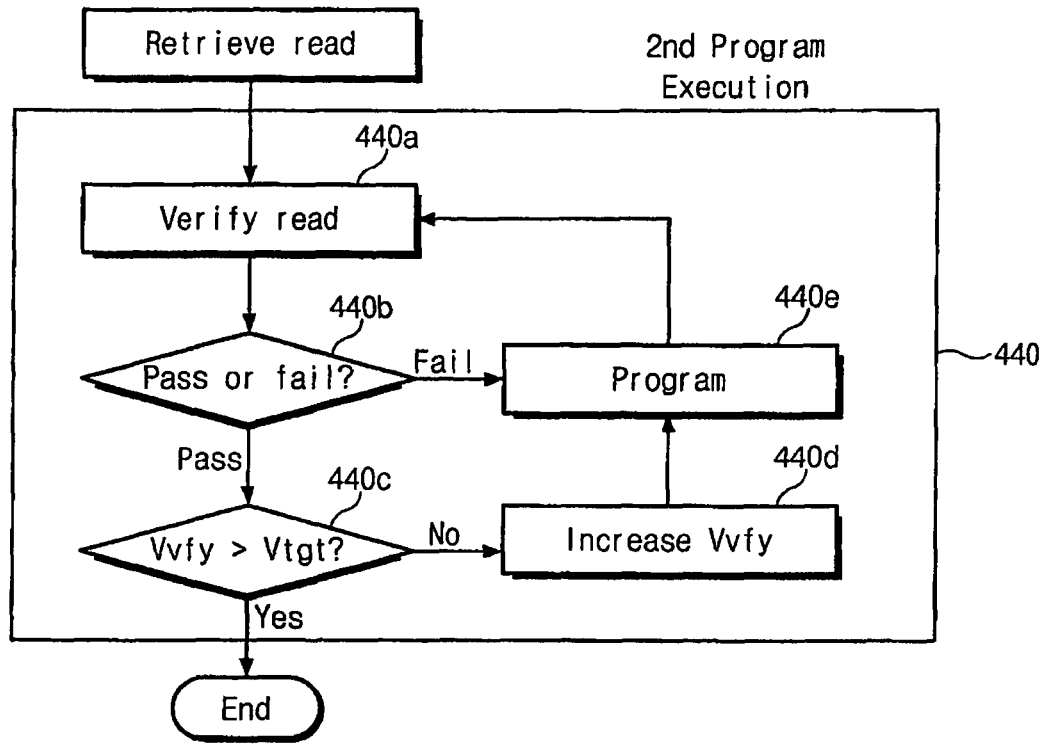
FIG. 10 is a flow chart showing the second programming operation, according to a second exemplary embodiment of the present invention.

FIG. 10 is a flow chart showing the second programming operation, in accordance with a second exemplary embodiment of the present invention.

Referring to FIG. 10, while the first embodiment uses a fixed level of the verifying voltage, the verifying voltage Vvfy of the second embodiment steps up incrementally to reach the target voltage Vtgt. However, as in the first embodiment, the second programming operation 340 according to the second embodiment is executed only for memory cells storing data "10" and "01". However, it is possible to conduct the second programming operation 340 even for the memory cells storing data "00" in order to more precisely control the threshold-voltage distributions.

As discussed with respect to FIG. 8, a verifying read step 440a may be executed before a programming step 440e. When a programmed result is detected as passed by a pass/fail checking step 440b, it is determined whether the verifying voltage Vvfy is greater than the target voltage Vtgt at step 440c. If not, the verifying voltage Vvfy is increased incrementally at step 440d, thereby gradually increasing the level of the verifying voltage Vvfy to the target voltage Vtgt. In other words, the verifying voltage Vvfy increases at step 440d when a programmed result passes. When the programmed result does not pass, the verifying voltage Vvfy does not increase and the programming operation resumes at the programming step 440e.

Figure 11A:
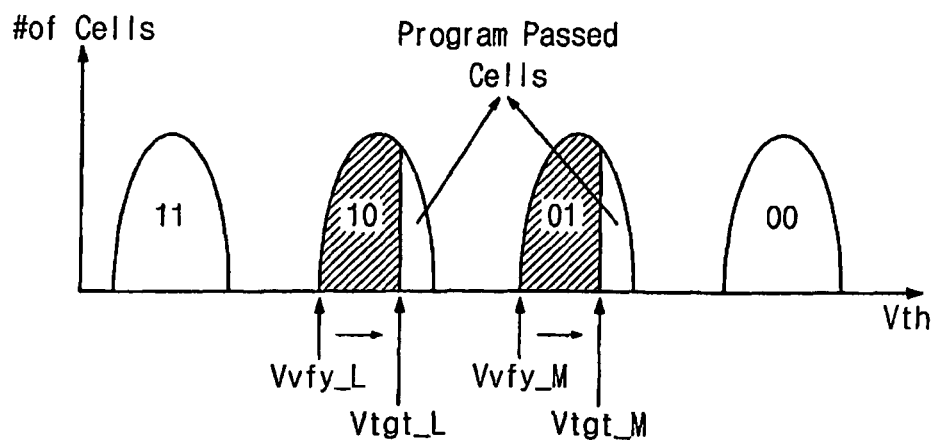
FIG. 11A is a graphic diagram of threshold-voltage distribution profiles of memory cells during the second programming operation, according to a second exemplary embodiment of the present invention.

FIG. 11A is a graphic diagram of threshold-voltage distribution profiles of memory cells during the second programming operation, according to the second exemplary embodiment of the present invention.

FIG. 11A shows that the verifying voltage Vvfy increases to the target voltage Vtgt. By increasing the verifying voltage Vvfy, the threshold-voltage distribution widths become narrower.

Figure 11B:
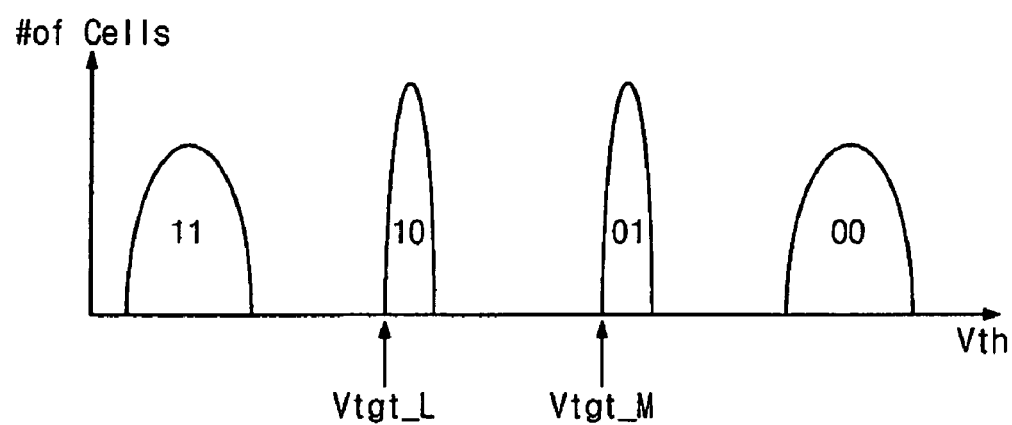
FIG. 11B is a graphic diagram of threshold-voltage distribution profiles of memory cells after the second programming operation, according to a second exemplary embodiment of the present invention.

FIG. 11B is a graphic diagram of threshold-voltage distribution profiles of memory cells after the second programming operation, according to the second exemplary embodiment of the present invention.

FIG. 11B shows that widths of the threshold-voltage distributions for the memory cells storing data "10" and "01" tend to be narrower after the second programming operation 340 than after the first programming operation 320. Since the memory cells storing data "11" and "00" are not subject to the second programming operation 340, their threshold-voltage distribution widths remain the same as after the first programming operation 320. In the same manner, the second programming operation 340 is executed to narrow the threshold-voltage distribution widths of the memory cells.

Figure 12:
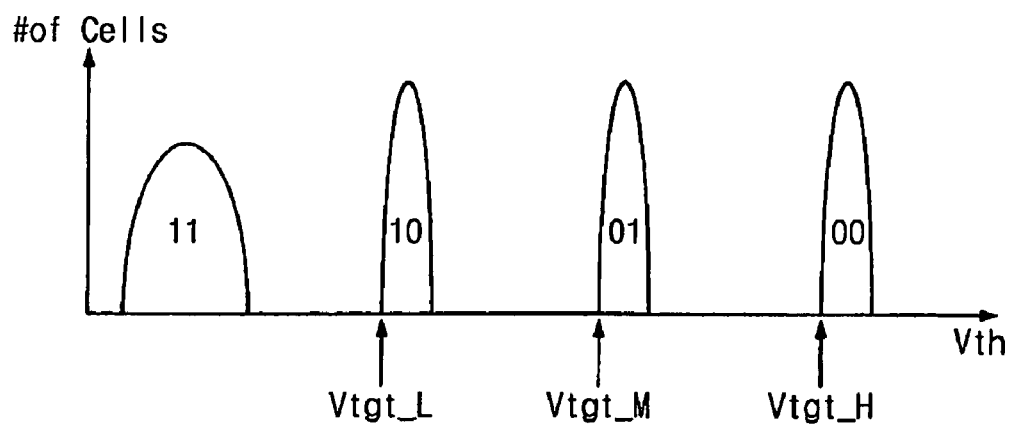
FIG. 12 is a graphic diagram of threshold-voltage distribution profiles of memory cells after the second programming operation, according to a third exemplary embodiment of the present invention.

FIG. 12 is a graphic diagram of threshold-voltage distribution profiles of memory cells after the second programming operation, according to a third exemplary embodiment of the present invention.

As in the embodiments shown by FIGS. 9B and 11B, FIG. 12 shows that widths of the threshold-voltage distributions for the memory cells storing data "10" and "01" tend to be narrower after the second programming operation 340 than after the first programming operation 320. In the third exemplary embodiment, since the memory cells storing data "00" are additionally included in the second programming operation 340, their corresponding threshold-voltage distribution widths are narrower than after the first programming operation 320, as well.

As previously stated, by loading the original data into the data buffer 260 through the retrieve-reading operation 330 after the first programming operation 320, it is possible to accomplish high integration density of the nonvolatile memory device by means of the second programming operation without an additional data buffer.

Figure 13:
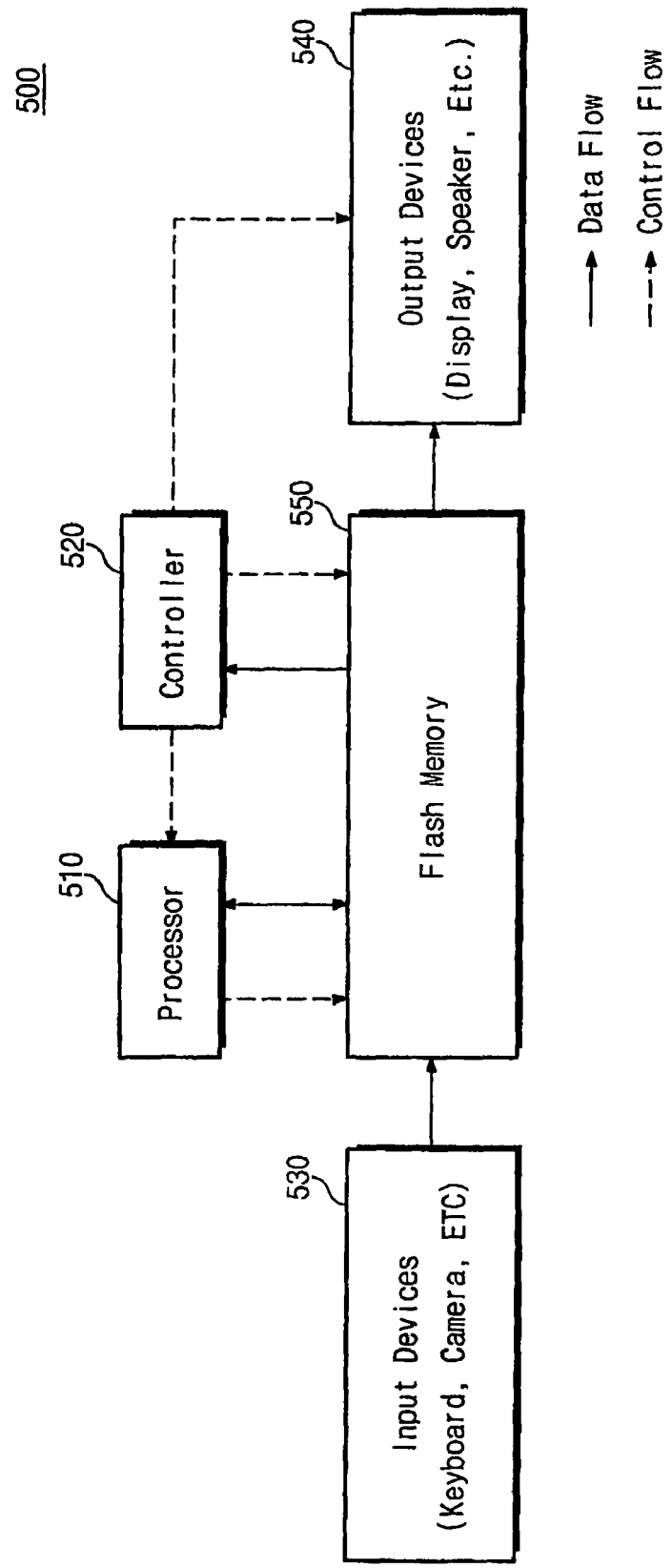
FIG. 13 is a functional block diagram of a computing system, including the flash memory, according to exemplary embodiments of the present invention.

FIG. 13 is a functional block diagram of a computing system including the flash memory, according to exemplary embodiments of the present invention.

Referring to FIG. 13, the computing system 500 includes a processor 510, a controller 520, input units 530, output units 540 and a flash memory 550. The solid lines indicate data flow and the dotted lines indicate control signal flow.

In the computing system 500, according to embodiments of the present invention, external data are input through input devices 530 (e.g., keyboard, camera, etc.). The input data may be commands by users, multimedia data such as image data taken by cameras, or the like. The input data are stored in the flash memory 550.

The controller 520 controls the components of the computing system 500 in response to commands stored in the flash memory 550. The processor 510 conducts processing operations in response to outputs of the controller 520. Processed results are also stored in the flash memory 550.

The output devices 540 operate to output data from the flash memory 550 in response to control signals output by the controller 520. The output devices 540 may provide visual and audio patterns or other perceptible information to the users. For example, the output devices 550 may include a display device, a speaker, etc.

The flash memory 550 may operate in substantially the same manner described above with respect to FIG. 3. The flash memory 550 may store N-bit data (where N=1 or a positive integer greater than 1), which has been processed or will be processed by the processor 510 under control of the controller 520.

The flash memory 550 and/or the controller 520 may be mounted on the system 500 through various types of packages, such as Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

Although not shown in FIG. 13, it is understood that a power supply unit is provided to the computing system 500. For example, if the computing system 500 is a mobile apparatus, it may further include a battery (not shown) for supplying power.

Due to the increased integration density of the flash memory 550, the computing system 500 may have proportionally enhanced performance. Furthermore, because of reductions in manufacturing costs of the flash memory 550, the computing system 500 may be proportionally reduced in product cost. It is possible to provide a flash memory card that includes a dedicated controller configured to control the flash memory 550.

As aforementioned, the various embodiments of the present invention improve integration density and reduce product costs of nonvolatile memory devices, e.g., by enabling repeated programming operations to be conducted without an additional data buffer.

The above-disclosed subject matter is to be considered illustrative, and not restrictive. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A programming method for a flash memory device, the method comprising:
    conducting a first programming operation for a memory cell;
    retrieving original data from the memory cell after the first programming operation; and
    conducting a second programming operation with reference to the original data and a second verifying voltage higher than a first verifying voltage of the first programming operation,
    wherein the second verifying voltage used in the second programming operation gradually increases to a predetermined level higher than the first verifying voltage of the first programming operation.

2. The programming method as set forth in claim 1, wherein the second programming operation is performed without verifying data corresponding to a highest threshold-voltage distribution.

3. The programming method as set forth in claim 1, wherein the flash memory device is a NOR type flash memory device.

4. The programming method as set forth in claim 1, wherein the memory cell comprises a multi-level cell.

5. The programming method as set forth in claim 4, wherein the memory cell is configured to store two-bit data.

6. A nonvolatile memory device comprising:
    a memory cell array comprising memory cells arranged in rows and columns;
    a reading/programming circuit configured to conduct a reading operation and a programming operation for the memory cell array;
    a data buffer configured to store data retrieved from the reading operation and data to be programmed by the programming operation; and
    a controller configured to enable the reading/programming circuit and the data buffer to conduct a first programming operation of the memory cells, a retrieve-reading operation to read original data from the memory cells, and a second programming operation of the memory cells based on the original data,
    wherein a second verifying voltage used in the second programming operation gradually increases to a predetermined level higher than a first verifying voltage of the first programming operation.

7. The nonvolatile memory device as set forth in claim 6, wherein the second programming operation is performed without verifying data corresponding to a highest threshold-voltage distribution.

8. The nonvolatile memory device as set forth in claim 6, wherein the memory cell comprises a multi-level cell.

9. The nonvolatile memory device as set forth in claim 8, wherein the memory cell is configured to store two-bit data.

10. A memory card comprising:
    a flash memory device; and
    a memory controller configured to control the flash memory device,
    wherein the flash memory device is programmed to execute the programming method of claim 1.

11. A memory card comprising:
    a flash memory device; and
    a memory controller configured to control the flash memory device, wherein the flash memory device comprises the non-volatile memory device of claim 6.

* * * * *